(12) United States Patent
Banarie et al.

(10) Patent No.: US 9,389,275 B2
(45) Date of Patent: Jul. 12, 2016

(54) TECHNIQUES FOR CALIBRATING MEASUREMENT SYSTEMS

(75) Inventors: Gabriel Banarie, Murroe (IE); Andreas Callanan, Murroe (IE); Damien McCartney, Raheen (IE); Colin Lyden, Baltimore (IE)

(73) Assignee: Analog Devices, Inc., Norwood, MA (US)

( * ) Notice: Subject to any disclaimer, the term of this patent is extended or adjusted under 35 U.S.C. 154(b) by 1147 days.

(21) Appl. No.: 13/362,208

(22) Filed: Jan. 31, 2012

(65) Prior Publication Data

US 2013/0193982 A1  Aug. 1, 2013

(51) Int. Cl.
*G01R 35/00* (2006.01)
*G01R 31/319* (2006.01)

(52) U.S. Cl.
CPC .................. *G01R 31/3191* (2013.01)

(58) Field of Classification Search
CPC ................. G01N 33/0006; G01N 33/0073
USPC ............................ 324/600–602, 76.11, 73.11
See application file for complete search history.

(56) References Cited

U.S. PATENT DOCUMENTS

| | | | |
|---|---|---|---|
| 6,380,747 B1 * | 4/2002 | Goldfine | G01R 27/2623 324/235 |
| 6,534,985 B2 * | 3/2003 | Holladay, III | G01V 3/104 324/202 |
| 6,924,755 B1 | 8/2005 | Callanan et al. | |
| 8,010,304 B2 | 8/2011 | Lu et al. | |

* cited by examiner

*Primary Examiner* — Vincent Q Nguyen
(74) *Attorney, Agent, or Firm* — Schwegman Lundberg & Woessner, P.A.

(57) ABSTRACT

Techniques to provide calibration of a measurement system in conjunction with measurement operations. The techniques may include providing a reference device in a signal processing chain within the measurement system. An excitation signal may be driven through the reference device while it may be connected to the signal processing chain within the measurement system and a calibration response may be captured. During a measurement operation, the reference device connection may be complemented with a sensor connection in the signal processing chain and the excitation signal may be driven through the signal processing chain. A measurement response may be captured from the system. The measurement system may generate a calibrated measurement signal that accounts for phase and/or amplitude errors within the system from the calibration response and the measurement response.

53 Claims, 7 Drawing Sheets

500

600

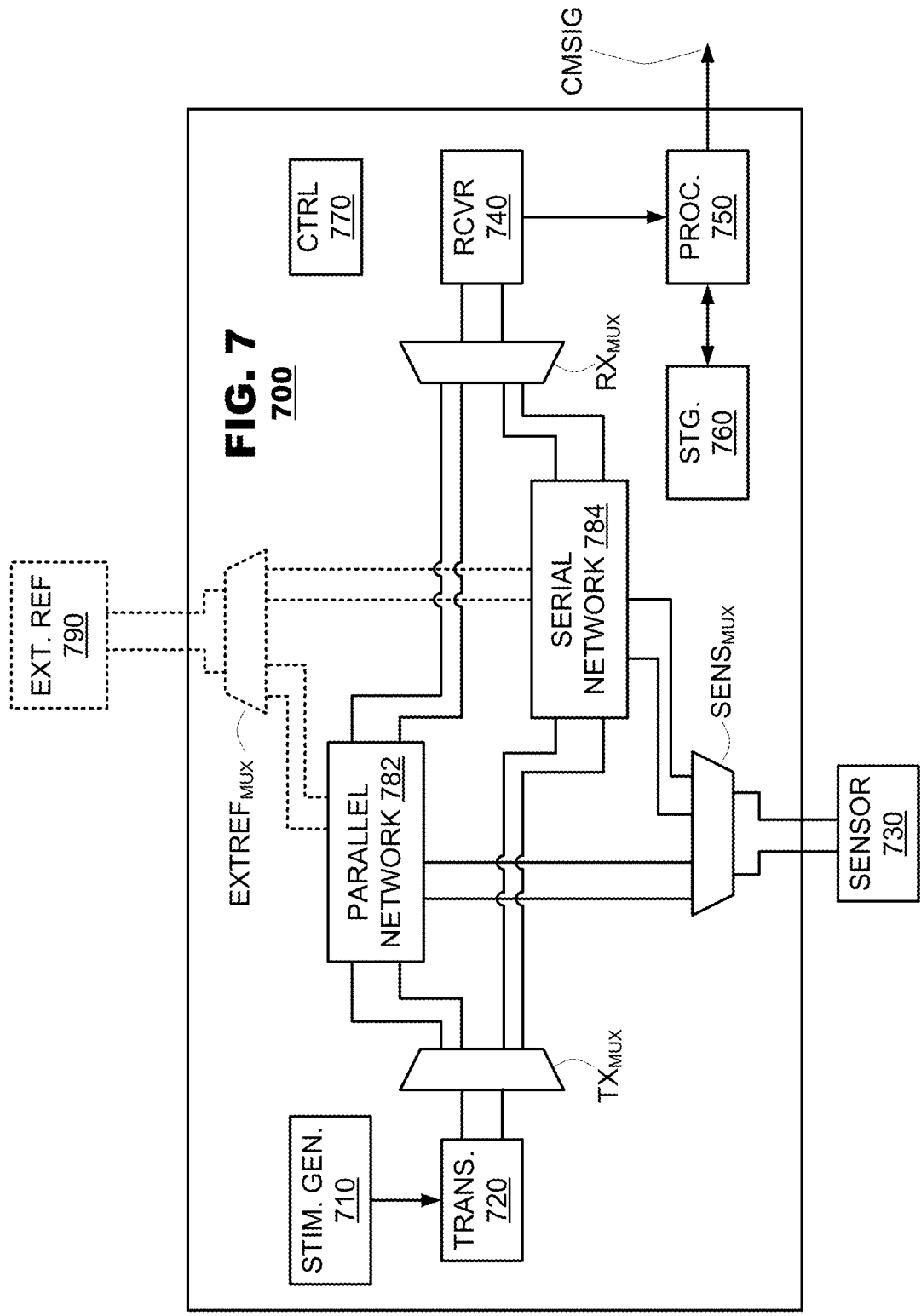

TECHNIQUES FOR CALIBRATING MEASUREMENT SYSTEMS

BACKGROUND

In a measurement system, a sensor has an electrical response to sensor stimuli that are measured by the sensor. Mathematically, the electrical response may be quantitatively complex—having both real and imaginary components. In such measurement systems these components typically may be used to determine the amplitude and phase components of the sensor's response to the stimuli. During operation of the measurement system, the sensor's response is analyzed to characterize the stimuli.

Such measurement systems include other components required to operate the sensor. These include power supplies, transmitters, and receivers for driving, receiving, and conditioning signals input to and output from the sensor. These components also may have a response that varies based on environmental stimuli. These environmental stimuli can include temperature, humidity, barometric pressure, and others. The combination of responses of these components to environmental stimuli causes measurements taken by the system to be erroneous. Thus, calibration is required for these components to remove the error that they induce on measurements.

Typically, such measurement systems are manufactured with rigid design specifications that require transmitters and receivers in the system to be produced such that the response of each component to certain environmental factors will be known within a predetermined degree of certainty. These specifications increase the manufacturing costs of such systems. Such systems also require certain environmental factors to be controlled within a predetermined range during measurement operations thus limiting the operating applications of the measurement systems.

Accordingly, there is a need in the art for techniques to calibrate a measurement system that may reduce the manufacturing costs of the system and improve the operating characteristics of the system.

BRIEF DESCRIPTION OF THE DRAWINGS

FIG. 7 illustrates another auto-calibration measurement system according to an embodiment of the present invention.

DETAILED DESCRIPTION

Embodiments of the present invention provide techniques to provide calibration of a measurement system in conjunction with measurement operations. The techniques may include providing a reference device in a signal processing chain for the measurement system. The reference device may have a predetermined response to various excitation signals. An excitation signal may be driven through the reference device while it may be connected to the signal processing chain within the measurement system and a calibration response may be captured. During a measurement operation, the reference device connection may be complemented with a sensor connection in the signal processing chain and the excitation signal may be driven through the signal processing chain. A measurement response may be captured from the system. The measurement system may generate a calibrated measurement signal that accounts for phase and/or amplitude errors within the system from the calibration response and the measurement response.

Figure 1:
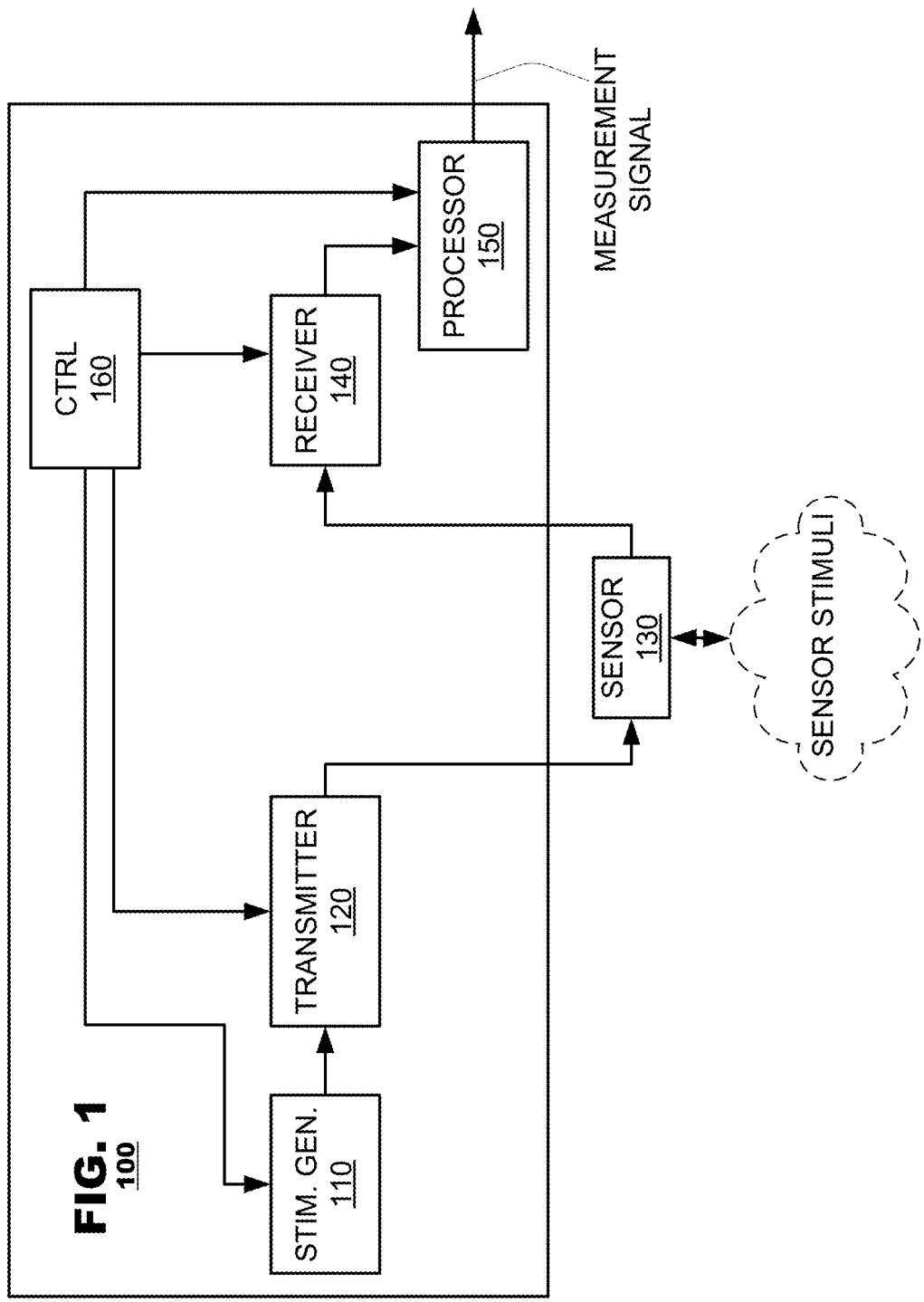
FIG. 1 illustrates a measurement system according to an embodiment of the present invention.

FIG. 1 illustrates a measurement system 100 according to an embodiment of the present invention. As illustrated in FIG. 1, the measurement system 100 may include a stimulus generator 110; a transmitter 120 coupled to the stimulus generator 110; a sensor 130 coupled to the transmitter 120; a receiver 140 coupled to the complex sensor; a processor 150 coupled to the receiver having an output for a measurement signal. Operation of each component (except the sensor 130) may be controlled by a controller 160. The stimulus generator 110, transmitter, 120, receiver 140, processor 150, and controller 160 may be manufactured in a single integrated circuit ("IC"). The sensor 130 may be external to the IC.

During system operation, the stimulus generator 110 may generate an excitation signal having a predetermined amplitude and phase. The signal may be either an analog or digital signal. The excitation signal output from the stimulus generator 110 may feed the transmitter 120. The transmitter 120 may apply a complex gain to the signal, and if necessary convert it to an analog signal. The transmitter 120 may also filter the signal before transmitting it to the sensor 130. As discussed, the transmitter 120 may induce a phase and/or amplitude response on the stimulus signal due to various operating and/or environmental factors. Thus, the signal output from the transmitter may include unknown complex components in addition to the controlled signal conditioning components.

The sensor 130 may generate a response to various sensor stimuli, wherein the response may be mathematically represented by phase and/or amplitude changes induced on the analog excitation signal. The response signal may be fed to the receiver 140. The receiver 140 may convert the response signal into digital values to be fed to the processor 150. The processor 150 may operate on the digital values to characterize the stimuli 160 and generate a resultant measurement signal therefrom. As discussed, the receiver 140 may also induce a phase and/or amplitude response on the excitation signal as it propagates through the system 100. Thus, the resultant measurement signal may include the phase and/or amplitude responses induced by the transmitter, receiver, and various other system components.

In an embodiment, the stimulus generator 110 may be a look up table indexed by a count value capable of generating various stimulus signals having predetermined amplitude and phase components. In another embodiment, the stimulus generator 110 may include an oscillator system to generate analog stimulus signals. In an embodiment, the transmitter 120 may include a digital-to-analog converter (DAC) and gain adjustment elements. In various embodiments, the sensor 130 may be a chemical sensor, temperature sensor, pressure sensor, gyroscopic sensor, accelerometer, an ultrasound transducer or any other physical and/or electrical sensing device. In an embodiment, the receiver 140 may include an analogto-digital (ADC) converter having a programmable sampling rate and gain adjustment. In another embodiment, the receiver may include a mixer to down convert a high frequency received to signal to a lower frequency output signal. A lower frequency downconverted signal may decrease the computational complexity of the system for performing calculations on the received signals.

Figure 2:
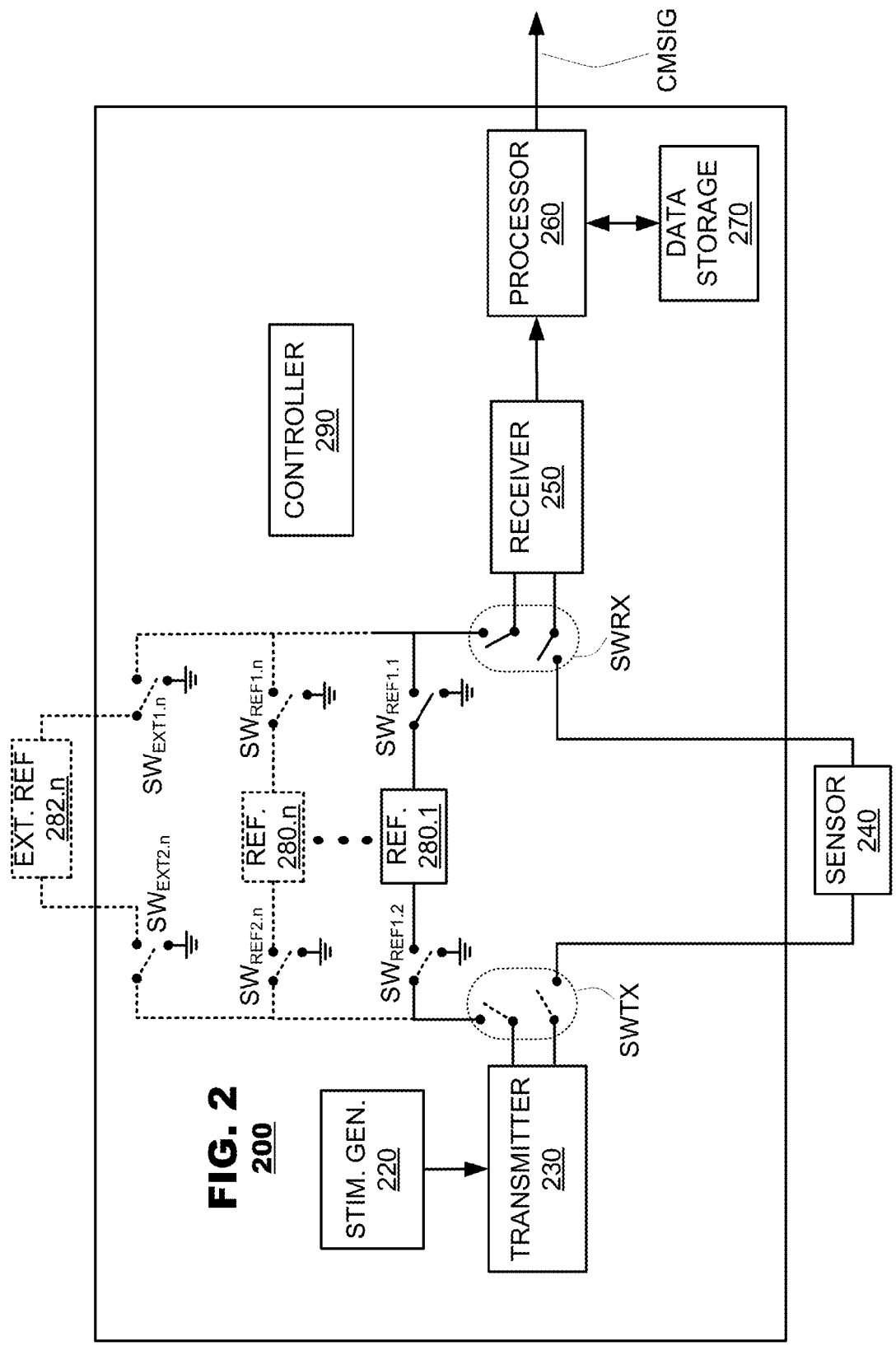
FIG. 2 illustrates an auto-calibration measurement system according to an embodiment of the present invention.

FIG. 2 illustrates an auto-calibration measurement system 200 according to an embodiment of the present invention. As illustrated, the auto-calibration measurement system 200 may include a signal processing chain having a stimulus generator 220, a transmitter 230, a sensor 240, a receiver 250, a processor 260, a data storage 270, and a controller 290. The signal processing chain may further include a reference device 280.1, which may be used for various calibration measurements for the system 200. The controller 290 may manage operation of the stimulus generator 220, transmitter 230, receiver 250, and processor 290 through control lines (not shown). The controller 290 may also manage operation of various switches in the system including a receiver switch, shown as SWRX, and a reference device switch, shown as $SW_{REF1.1}$, through corresponding control lines (not shown).

The receiver switch SWRX may be used to couple the receiver 250 to the reference device 280.1, the sensor 240, or both. The reference device switch $SW_{REF1.1}$ may be used to couple the internal reference device 280.1 to the signal processing chain or to ground ("GND") for various operational modes.

The reference device 280.1 may be connected in parallel with the sensor 240. The reference device 280.1 may be configured such that its response may be mathematically represented as a real response or an imaginary response depending on the type of reference device 280.1 used in the system. In various embodiments, the reference device may be a capacitor, an inductor, or a resistor. As illustrated, the transmitter-side of the signal processing chain may be connected to the sensor 240 and the reference device 280.1. This may create a constant load for the transmitter 230, which may improve the stability of excitation signals injected into the signal processing chain. Further, such a constant load at the input of the receiver 250 may also decrease its design complexity. However, in an embodiment, a transmitter switch SWTX may be used to control coupling the transmitter 230 to the reference device 280.1, the sensor 240, or both for various operating modes. In another embodiment, the reference device 280.1 may also have a transmitter side of reference device switch $SW_{REF1.2}$.

Auto-Calibration Operation

As discussed, various components of the signal processing chain including the transmitter 230 and/or receiver 250 may induce unknown phase delays or amplitude gain effects on an excitation signal as it may pass through the signal processing chain. The degree to which system "unknowns" vary may depend on the rate that environmental conditions of the system 200 may change during operation (i.e., changes in temperature, barometric pressure, humidity, etc.). The system 200 may generate an "auto-calibrated" measurement result, shown here as CMSIG, which may more closely represent the sensor 240 response to various physical and/or environmental stimuli and minimize the system unknowns throughout changes in environmental operating conditions of the system 200.

The system 200 may operate to capture calibration samples which may be used to determine the compensated measurement signal CMSIG. The calibration samples may be captured by driving a predetermined excitation signal from the stimulus generator 220 into the transmitter 230 for conditioning. The transmitter 230 may inject the conditioned signals into the sensor 240 and the reference device 280.1. In various configurations, the signal processing chain to the receiver 250 may be completed by coupling the sensor 240 to the receiver 250, the reference device 280.1 to the receiver 250, or both to the receiver 250. The receiver 250 may capture calibration samples from the desired signal processing chain and transmit the samples to the processor 260, which may store the calibration samples in data storage 270.

To generate the compensated measurement signal CMSIG, the system 200 may drive the predetermined excitation signal from the stimulus generator 220 into the transmitter 230. The transmitter 230 may condition the excitation signal and drive it into the sensor 240 and the reference device 280.1. In order to generate the compensated measurement signal CMSIG, the signal processing chain to receiver 250 may be configured in a manner different from the configuration used during the capturing of the calibration samples. The receiver 250 may capture measurement samples and transmit the samples to the processor 260. The processor 260 may generate the compensated measurement signal CMSIG from the calibration samples and the measurement samples.

For example, say calibration samples may be captured from a signal processing chain to the receiver 250 which may include the reference device 280.1 but not the sensor 240. Corresponding measurement samples may be captured from a signal processing chain to the receiver 250 which may include both the reference device 280.1 and the sensor 240. In turn, the processor 260 may calculate a compensated measurement signal CMSIG which may represent the response of the sensor 240 by calculating a difference between the calibration samples and the measurement samples. Calculations associated with determining various compensated measurement signals are described below, and may vary in relation to the type and/or size of reference device 280.1 that may be coupled to the signal processing chain (i.e., capacitor, inductor, and/or resistor).

In an embodiment, the system 200 may successively capture calibration samples and then measurement samples in order to generate compensated measurement signals CMSIG. The system may operate in this manner when the environmental operating conditions for the system 200 may vary quickly or by a large amount during operation. In another embodiment, the system may capture and store a set of calibration samples which may be used to generate compensated measurement signals CMSIG for multiple measurements. The system may operate in this manner when the operating conditions for the system 200 may vary slowly or by a small amount during system operation. An external controller or processor (not shown) may control the frequency at which system 200 may capture and store calibration samples.

In yet another embodiment, the system 200 may capture and store sets of calibration samples for different signal processing chain configurations and/or different environmental operating conditions. The system 200 may use the stored calibration sample sets to perform various system verifications. For example, say a calibration sample set may be captured and stored from a signal processing chain to the receiver 250 which may include both the reference device 280.1 and the sensor 240. If, during operation of the system 200, it is desired to verify the response of the reference device 280.1 to changes in environmental conditions, corresponding measurement samples may be captured from a signal processing chain to the receiver 250 which may include the sensor 240 but not the reference device. A compensated measurement signal CMSIG may be calculated using the aforementioned stored calibration samples which may represent the response of the reference device 280.1, which may be used to verify operation of the reference device 280.1.

The above examples illustrate that the signal processing chain may be configured with any combination of the reference device 280.1 and the sensor 240 for capturing and/or storing calibration samples and measurement samples. This may provide the system 200 the ability to flexibly adjust the signal processing chain to generate compensated measurement signals CMSIG for a variety of operating conditions and/or a variety of reference devices. In various embodiments, the system 200 may include a plurality of reference devices 280.n, each which may be controllably coupled to the signal processing chain by switch $SW_{REF1.n}$ and/or $SW_{REF2.n}$. In various embodiments, the system 200 may be coupled to external reference devices 282.n, each that may be controllable coupled to the signal processing chain by switch $SW_{EXT1.n}$ and/or $SW_{ExT2.n}$. The system reference devices 280.1-280.n and/or the external reference devices 282.n may be configured as any combination of capacitors, inductors, and/or resistors, each which may have different responses to different excitation signals. Thus, the system 200 may be operated to generate compensated measurement signals CMSIG for a plurality of excitation signals.

For example, the sensor 240 may generate different responses depending on the environmental operating conditions of the system 200 (i.e., varying temperature, barometric pressure, etc.) and/or the frequency of the excitation signal driven into the sensor 240. By providing a variety of the reference device types and/or sizes, the system 200 may be configured to generate compensated measurement signals CMSIG for a variety of operating conditions. In various embodiments, the system 200 may include multiple sensors (not shown), which may be coupled to the system. This may further provide the system 200 with the ability to generate compensated measurement signals CMSIG for a variety of operating conditions.

In an embodiment, the reference device switch $SW_{REF1.1}$ may be left open or floating when the reference device may not be coupled to the receiver 250. In another embodiment, the reference device switch $SW_{REF1.1}$ may be configured to couple the receiver side of the reference device 280.1 to the transmitter side of the reference device 280.1 when the device may not be coupled to the receiver 250.

The excitation signal may be a sinusoidal signal, a square-wave signal, or any periodic signal of the like. The excitation signal may be a voltage signal or a current signal. For voltage excitation signals, the capacitive response, and/or conductance of the sensor 240 may be determined. For current excitation signals, the inductive response and/or resistance of the sensor 240 may be determined. In an embodiment, an excitation signal may be injected to the system 200 from an external stimulus generator (not shown).

In an embodiment, the stimulus generator 220, transmitter 230, reference device 280.1, receiver 250, processor 260, data storage 270, and controller 290 may be manufactured in an integrated circuit ("IC"), while the sensor 240 may be external to the circuit. In another embodiment, sensor 240 may be manufactured within the IC as well. In various embodiments, the integrated circuit may include a single die, multiple dies in a single package, or multiple packages.

Auto-Calibration Operation for Various Measurement System Types

Embodiments of the present invention may provide techniques to generate compensated measurement signals CMSIG for various types of measurement systems. The system types may relate to manufacturing specifications for the transmitter 230 and the receiver 250. In one type of measurement system 200, the transmitter 230 and the receiver 250 may be manufactured with relaxed factory specifications such that the amplitude gain and the phase delay for each may be unknown. For this type of system 200, auto-calibration may be performed to minimize the unknown effects of both amplitude gain and phase delay in the compensated measurement signal CMSIG. This type of system be referred to herein as a "Type I" system. For a Type I system, the amplitude gain and phase response of the reference device 280.1 may be known.

In another type of system, the transmitter 230 and the receiver 250 may be manufactured to more demanding specifications such that the amplitude gain for each may be known, but the phase delay may be unknown. For this type of system 200, auto-calibration may be performed to minimize the unknown effects of phase delays in the compensated measurement signal. The gain effects may be minimized through calculations based on the factory specifications for the receiver 230 and transmitter 250. The gain of the transmitter 230 and the receiver 250 may be known within a predetermined degree of precision for various operating conditions. This type of system may be referred to herein as a "Type II" system. For Type II systems, only the type of reference device 280.1—resistive, capacitive, or inductive—may be known.

For both system types—Type I and Type II—the compensated measurement signal CMSIG may be generated using either of two calibration modes, which may be referred to as "direct" and "adaptive." For direct calibration modes, the system 200 may capture calibration samples and measurement samples using an excitation signal having a constant phase and amplitude. From the calibration samples and measurement samples, the system 200 may generate the compensated measurement signal CMSIG by performing calculations with the captured samples.

For adaptive calibration modes, the system 200 may capture calibration samples through iterative cycles using an excitation signal having a constant amplitude, but the phase may be adjusted through each iterative cycle. For example, an initial excitation signal phase may be 0°. The system 200 may adjust the phase of the excitation signal to calibrate the phase response of the reference device 280.1. For reference device types having an expected response that may be mathematically represented as purely imaginary (i.e., capacitors and/or inductors), the system 200 may adjust the phase of the excitation signal through iterative cycles to minimize any measured real response of the reference device 280.1 to the excitation signals. For reference device types having an expected response that may be mathematically represented as purely real (i.e., resistors), the system 200 may adjust the phase of the excitation signal to minimize any measured imaginary response of the reference device 280.1 to the excitations signals. Predetermined thresholds may be set for measuring the responses of the respective device types. Upon determination that a response may be below a predetermined threshold for a reference device type, the system 200 may "lock" the phase of the excitation signal to capture measurement samples. Using the locked excitation signal, the system 200 may capture and store calibration samples and measurement samples for various signal processing chain configurations and calculate compensated measurement signals CMSIG from the samples. The frequency that the system 200 may perform adaptive phase calibrations to adjust the locked excitation signal may vary depending on environmental operating conditions. An external controller or processor (not shown) may control the frequency that adaptive phase calibrations may be performed to re-adjust the phase of the excitation signal.

Adaptive calibration modes may be useful to minimize the computational load on the processor 260 to generate a compensated measurement signal CMSIG, as the measurement samples generated following an adaptive calibration may already be phase compensated, leaving only the gain of the compensated measurement signal CMSIG to be calculated/adjusted. However, the time to calibrate the system may increase. Direct calibration modes be useful to decrease calibration time, but may increase the computational load on the processor 260 to generate a compensated measurement signal.

Auto-calibration Operation for a Type I System

Operation of a Type 1 system using direct calibration modes may be performed as discussed above. The system 200 may capture and store calibration samples and measurement samples for various signal processing chain configurations and generate a compensated measurement signal CMSIG by calculating a difference between the samples. The processor 260 may calculate real and imaginary components $CMSIG_{RE}$, $CMSIG_{IM}$ for each sample of the compensated measurement signal. The calculations may vary depending on the type of reference 280.1 used for a signal processing chain configuration.

For example, say a capacitive reference device 280.1 may be used for an auto-calibration operation of a Type I system. Calibration samples may be captured for a signal processing chain including the reference device 280.1 and measurement samples may be captured for a signal processing chain including the sensor 240. The system may generate the real and imaginary components $CMSIG_{RE}$, $CMSIG_{IM}$ for each sample of the compensated measurement signal by performing calculations with the calibration and measurement samples. Equations 1 and 2 illustrate calculations that may be performed to generate real and imaginary components $CMSIG_{RE}$, $CMSIG_{IM}$ of a compensated measurement signal representing the response of the sensor 240.

$$CMSIG_{RE} = \frac{Re(X) \cdot Im(Z) - Im(X) \cdot Re(Z)}{(Re(Z))^2 + (Im(Z))^2} \quad \text{Eq. 1}$$

$$CMSIG_{IM} = \frac{Re(X) \cdot Re(Z) + Im(X) \cdot Im(Z)}{(Re(Z))^2 + (Im(Z))^2} \quad \text{Eq. 2}$$

In another example, say an inductive reference device 280.1 may be used under similar signal processing chain configurations. Equations 3 and 4 illustrate calculations that may be performed to generate real and imaginary components $CMSIG_{RE}$, $CMSIG_{IM}$ of a compensated measurement signal representing the response of the sensor 240.

$$CMSIG_{RE} = \frac{Im(X) \cdot Re(Z) - Re(X) \cdot Im(Z)}{(Re(Z))^2 + (Im(Z))^2} \quad \text{Eq. 3}$$

$$CMSIG_{IM} = \frac{Re(X) \cdot Re(Z) + Im(X) \cdot Im(Z)}{(Re(Z))^2 + (Im(Z))^2} \quad \text{Eq. 4}$$

In another example, say a resistive reference device 280.1 may be used under similar signal processing chain configurations. Equations 5 and 6 illustrate calculations that may be performed to generate real and imaginary components $CMSIG_{RE}$, $CMSIG_{IM}$ of a compensated measurement signal representing the response of the sensor 240.

$$CMSIG_{RE} = \frac{Re(X) \cdot Re(Z) + Im(X) \cdot Im(Z)}{(Re(Z))^2 + (Im(Z))^2} \quad \text{Eq. 5}$$

$$CMSIG_{IM} = \frac{Im(X) \cdot Re(Z) - Re(X) \cdot Im(Z)}{(Re(Z))^2 + (Im(Z))^2} \quad \text{Eq. 6}$$

For Eqs. 1-6, the variables $Re(Z)$ and $Im(Z)$ may represent the respective real and imaginary components for each calibration sample. The variables $Re(X)$ and $Im(X)$ may represent the real and imaginary components for each measurement sample. The excitation signal may be assumed to be a voltage signal in which the capacitive response of the sensor 240 may be determined. Equations 1-6 may be adjusted for current excitation signals to account for the 90° shift of the signal processing chain response.

Operation of a Type I system using adaptive calibration modes may be performed as discussed above depending on the type of reference device 280.1 to be used. The system 200 may perform an adaptive phase calibration of the reference device 280.1 and lock the phase of the excitation signal accordingly. Recall, that for a Type I system, both the gain and phase response of the transmitter 230 and receiver 250 may be unknown. Through adaptive calibration, the phase response of the system may be calibrated with respect to the reference device 280.1. Following adaptive phase calibration, the system 200 may capture and store calibration samples and measurement samples for various signal processing chain configurations and calculate a compensated measurement signal CMSIG from the samples.

The processor 260 may calculate the gain of the real and imaginary components $CMSIG_{RE}$, $CMSIG_{IM}$ for each sample of the compensated measurement signal. The calculations may vary depending on the type of reference 280.1 used. For example, say a capacitive reference device 280.1 may be used. Measurement samples may be captured for a signal processing chain including the sensor 240. The system may generate the real and imaginary components $CMSIG_{RE}$, $CMSIG_{IM}$ for each sample of the compensated measurement signal by performing calculations with the calibration and measurement samples and adjusting the real and imaginary components accordingly. Equations 7 and 8 illustrate calculations that may be performed to generate the real and imaginary components $CMSIG_{RE}$, $CMSIG_{IM}$ of a compensated measurement signal representing the response of the sensor 240.

$$CMSIG_{RE} = \frac{Re(X)}{Im(Z)} \quad \text{Eq. 7}$$

$$CMSIG_{IM} = \frac{Im(X)}{Im(Z)} \quad \text{Eq. 8}$$

In another example, say an inductive reference device 280.1 may be used under similar signal processing chain configurations. Equations 9 and 10 illustrate calculations that may be performed to generate real and imaginary components $CMSIG_{RE}$, $CMSIG_{IM}$ of a compensated measurement signal representing the response of the sensor 240.

$$CMSIG_{RE} = \frac{Re(X)}{Im(Z)} \quad \text{Eq. 9}$$

-continued $$CMSIG_{IM} = \frac{Im(X)}{Im(Z)} \quad \text{Eq. 10}$$

In another example, say a resistive reference device 280.1 may be used under similar signal processing chain configurations. Equations 11 and 12 illustrate calculations that may be performed to generate real and imaginary components $CMSIG_{RE}$, $CMSIG_{IM}$ of a compensated measurement signal representing the response of the sensor 240.

$$CMSIG_{RE} = \frac{Re(X)}{Re(Z)} \quad \text{Eq. 11}$$

$$CMSIG_{IM} = \frac{Im(X)}{Re(Z)} \quad \text{Eq. 12}$$

For Eqs. 7-12, the variables Re(Z) and Im(Z) may represent the respective real and imaginary components for each calibration sample. The variables Re(X) and Im(X) may represent the real and imaginary components for each measurement sample. The excitation signal may be assumed to be a voltage signal. Equations 7-12 may be adjusted for current signals to account for the 90° shift of the signal processing chain response.

Auto-Calibration Operation for a Type II System

Operation of a Type II system using direct calibration modes may be performed as discussed above. The system 200 may capture and store calibration samples and measurement samples for various signal processing chain configurations and generate a compensated measurement signal CMSIG by performing various calculations with the calibration and measurement samples. The processor 260 may calculate real and imaginary components $CMSIG_{RE}$, $CMSIG_{IM}$ for each sample of the compensated measurement signal. Similar to a Type I system using direct calibration, the direct calculations for a Type II may vary depending on the type of reference 280.1 used. The processor 260 may calculate the real and imaginary components $CMSIG_{RE}$, $CMSIG_{IM}$ for each sample using equations similar to those described for Eqs. 1-6, however, each equation may include a square root operation performed on the denominator component for each calculation. For this reason, direct calibration of a Type II system may be computationally expensive for the processor 260. Still, direct calibration for a Type II system may allow for precision calculation of the compensated measurement signal for temperature drifts that may occur for the reference device 280.1.

Operation of a Type II system using adaptive calibration modes may be performed as discussed above depending on the type of reference device 280.1 to be used. The system 200 may perform an adaptive phase calibration of the reference device 280.1 and lock the phase of the excitation signal accordingly. Recall, that for a Type II system only the phase response of the transmitter 230 and receiver 250 may be unknown. Therefore, following an adaptive phase calibration, the processor 260 may adjust the real and imaginary components $CMSIG_{RE}$, $CMSIG_{IM}$ for each sample of the compensated measurement signal using the factory gain values for the transmitter 230 and the receiver 250.

Figure 3:
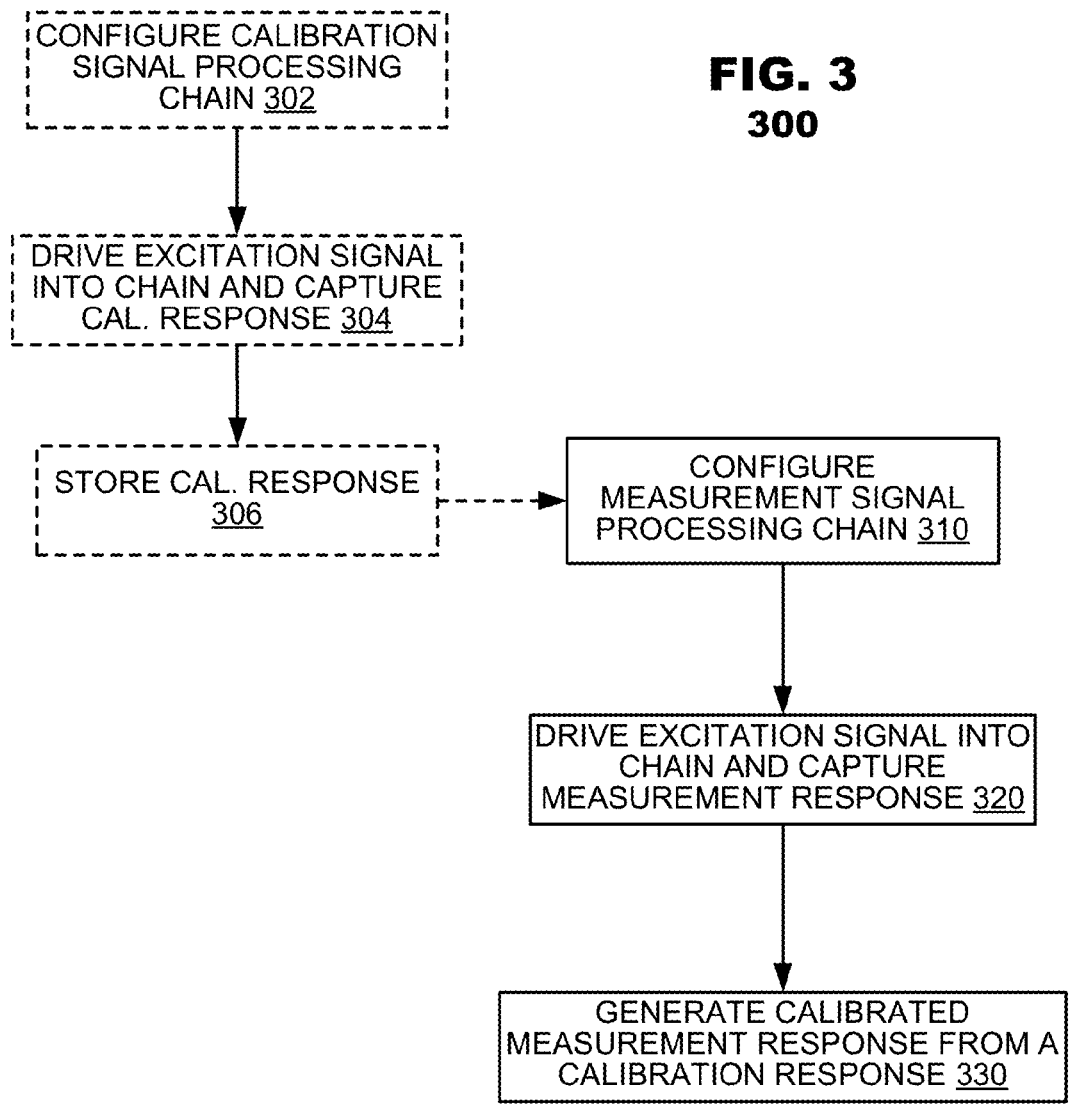
FIG. 3 illustrates a method for generating a compensated measurement signal from an auto-calibration measurement system using direct calibration operation according to an embodiment of the present invention.

FIG. 3 illustrates a method 300 for generating a compensated measurement signal from an auto-calibration system using direct calibration according to an embodiment of the present invention. The method 300 may configure a measurement signal processing chain (block 310). The method 300 may drive an excitation signal into the measurement signal processing chain and capture a measurement response signal from the measurement signal processing chain (block 320). The method 300 may adjust the measurement response signal using a calibration response signal captured from a calibration signal processing chain to generate a compensated measurement signal (block 330).

In an embodiment, the method 300 may configure a calibration signal processing chain (block 302). The method 300 may drive the excitation signal into the calibration signal processing chain and capture a calibration response signal from the chain (block 304). In an embodiment, the method 300 may store a representation of the calibration response signal in a data storage (block 306).

In various embodiments, the method 300 may generate the compensated measurement signal by performing calculations based on the reference device type. For example, for a Type I measurement system, the real and imaginary components of the compensated measurement signal may be calculated based on the reference device type. Equations 1-6 illustrate calculations that the method 300 may perform for various reference device types for a voltage excitation signal. Equations 1-6 may be adjusted for a current excitation signal.

In various embodiments, the measurement and calibration signal processing chain configurations may include any combination of a reference device or a sensor (i.e., internal and/or external reference devices and/or sensors) wherein the measurement and calibration signal processing chains may be configured in a different manner. In an embodiment, the method 300 may generate a compensated measurement signal from successively captured calibration and measurement response signals. For example, if the environmental operating conditions for an auto-calibration system 200 of FIG. 2 may vary quickly or by a large degree over time, the method may generate a compensated measurement signal from calibration and measurement response signals captured in a successive manner. In another embodiment, the method 300 may generate a plurality of compensated measurement signals from a stored representation of a captured calibration response signal and a plurality of captured measurement response signals. For example, if the environment operating conditions for an auto-calibration system 200 of FIG. 2 may vary slowly or by a small degree over time, the method may generate a plurality of compensated measurement signals using a stored representation of the captured calibration response signal and a plurality of captured measurement response signals.

Figure 4:
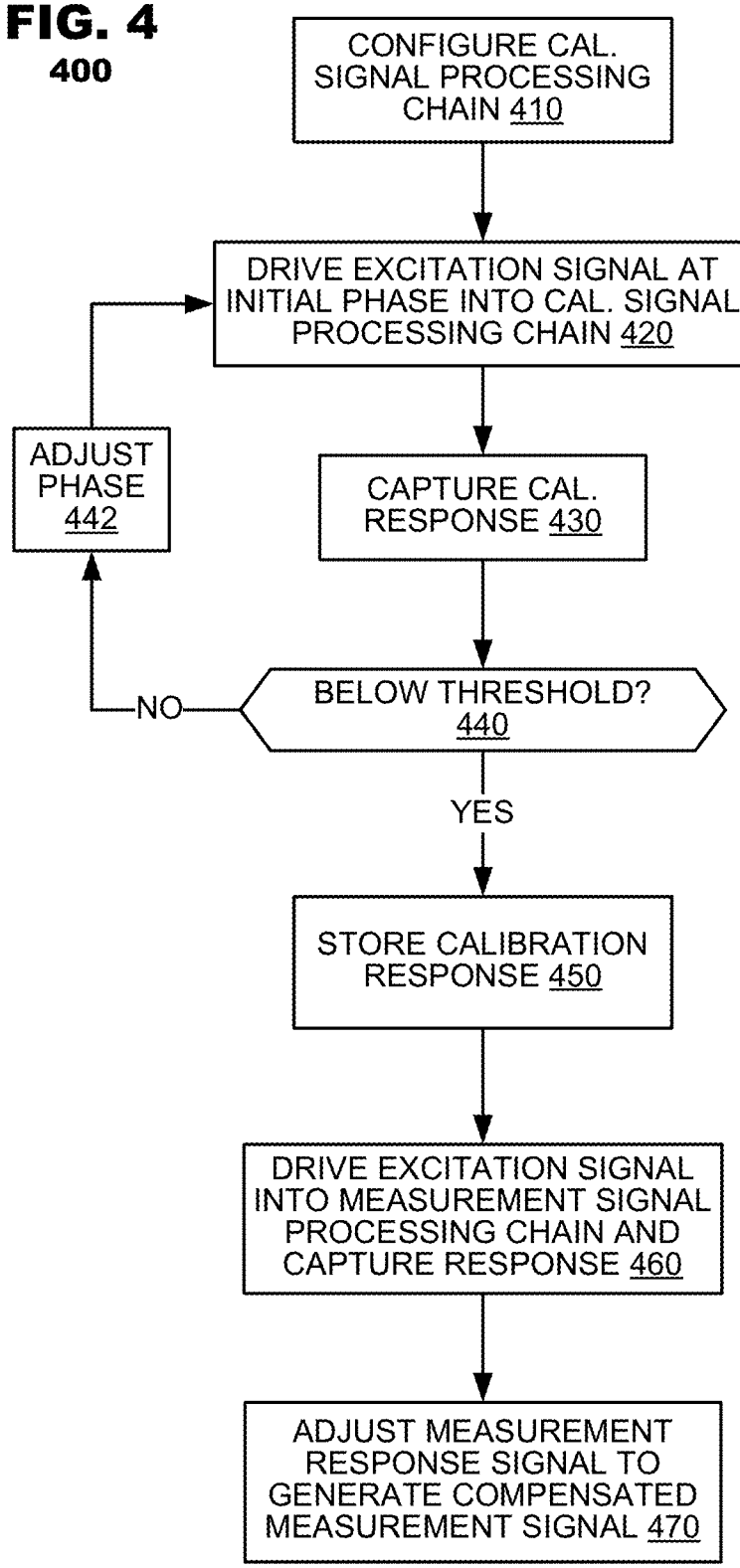
FIG. 4 illustrates a method for generating a compensated measurement signal from an auto-calibration measurement system using adaptive calibration operation according to an embodiment of the present invention.

FIG. 4 illustrates a method 400 for generating a compensated measurement signal from an auto-calibration measurement system using adaptive calibration according to an embodiment of the present invention. The method 400 may configure a calibration signal processing chain for the system including a reference device (block 410). The method may drive an excitation signal having a predetermined amplitude and initial phase into the calibration signal processing chain (block 420). The method may capture a calibration response signal from the calibration signal processing chain generated in response to the excitation signal (block 430). The method may compare the calibration signal to a predetermined threshold related to the reference device type (block 440). If the calibration signal is above the predetermined threshold, the method may adjust the excitation signal phase to minimize the response of the calibration signal processing chain to below the predetermined threshold (return to block 430). If the calibration signal is below the predetermined threshold, the method may store a representation of the calibration response signal (block 450). The method 400 may drive the excitation signal into a second signal processing chain including a sensor and capture measurement samples (block 460). The method 400 may adjust the measurement response signal to generate a compensated measurement signal (block 470).

For example, for a Type I measurement system, gain adjustments for the real and imaginary components of the compensated measurement signal may be calculated based on the reference device type. Equations 7-12 illustrate calculations that the method 400 may perform for various device types for a voltage excitation signal. Equations 7-12 may be adjusted for a current excitation signal. For a Type II measurement system, for example, the method 400 may adjust the measurement response signal to generate the compensated measurement signal by performing gain adjustments based on the factory calibration settings for a receiver and/or transmitter.

In an embodiment, the predetermined threshold may include an upper and lower threshold limit. In various embodiments in which the reference device may be a capacitive or inductive reference device, the predetermined threshold may be set for comparing the real component of the calibration samples to the predetermined threshold. In an embodiment in which the reference device may be a resistive reference device, the predetermined threshold may be set for comparing the imaginary component of the calibration samples to the predetermined threshold.

Figure 5:
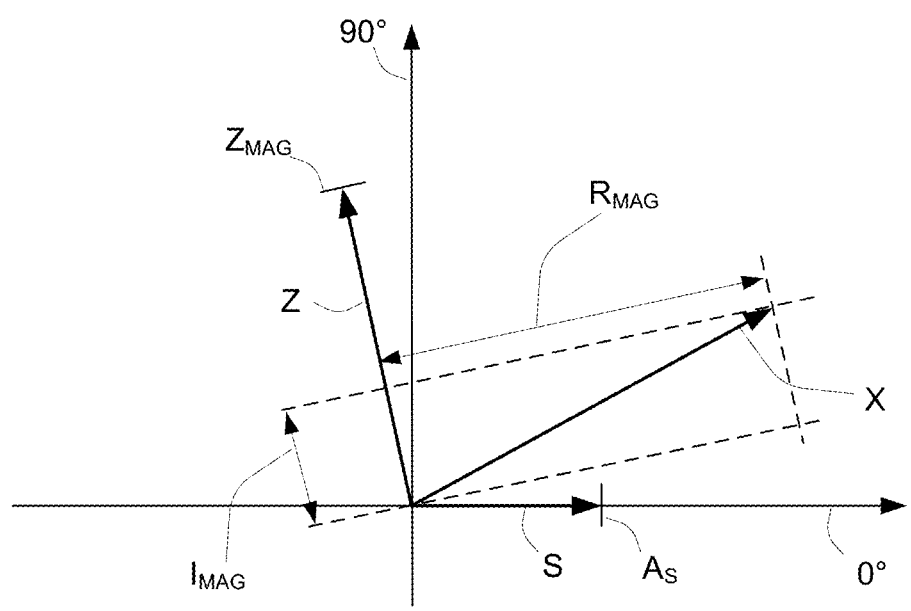
FIG. 5 illustrates a phasor model representing signal processing chain responses of a reference device and sensor to an excitation signal according to an embodiment of the present invention.

FIG. 5 illustrates a phasor model 500 representing signal processing chain responses of a reference device and sensor to an excitation signal according to an embodiment of the present invention. A phasor 'X' is indicated for a signal processing chain response including the sensor. A phasor 'Z' is indicated for a signal processing chain response including the reference device. The phasor 'Z' indicates a capacitive reference device. A phasor 'S' is indicated for the excitation signal. The excitation signal phasor 'S' indicates an excitation signal having a 0° phase and constant amplitude.

As indicated in the model 500, the system response including the reference device (phasor 'Z') is shifted away from a 90° expected response for such a capacitive reference device. The shift may be due to unknown phase effects induced on the excitation signal as it passes through the signal processing chain. The magnitude of the system response including the reference device is shown as $Z_{MAG}$.

Recall, for a Type I system the size and type of the reference device may be known. Based on this information, the real and imaginary components of the system response including the sensor may be calculated to minimize system unknowns. Conceptually, the magnitude of the component shown as $I_{MAG}$ may represent the magnitude of the imaginary response of the sensor which may be in phase with the reference device response. The magnitude of the component shown as $R_{MAG}$ may represent the magnitude of the real response of the sensor which may be in quadrature with the reference device response. The components $I_{MAG}$ and $R_{MAG}$ may be determined using Eqs. 1-6 as illustrated in FIG. 1 for a voltage excitation signal having a constant phase and amplitude.

Figure 6:
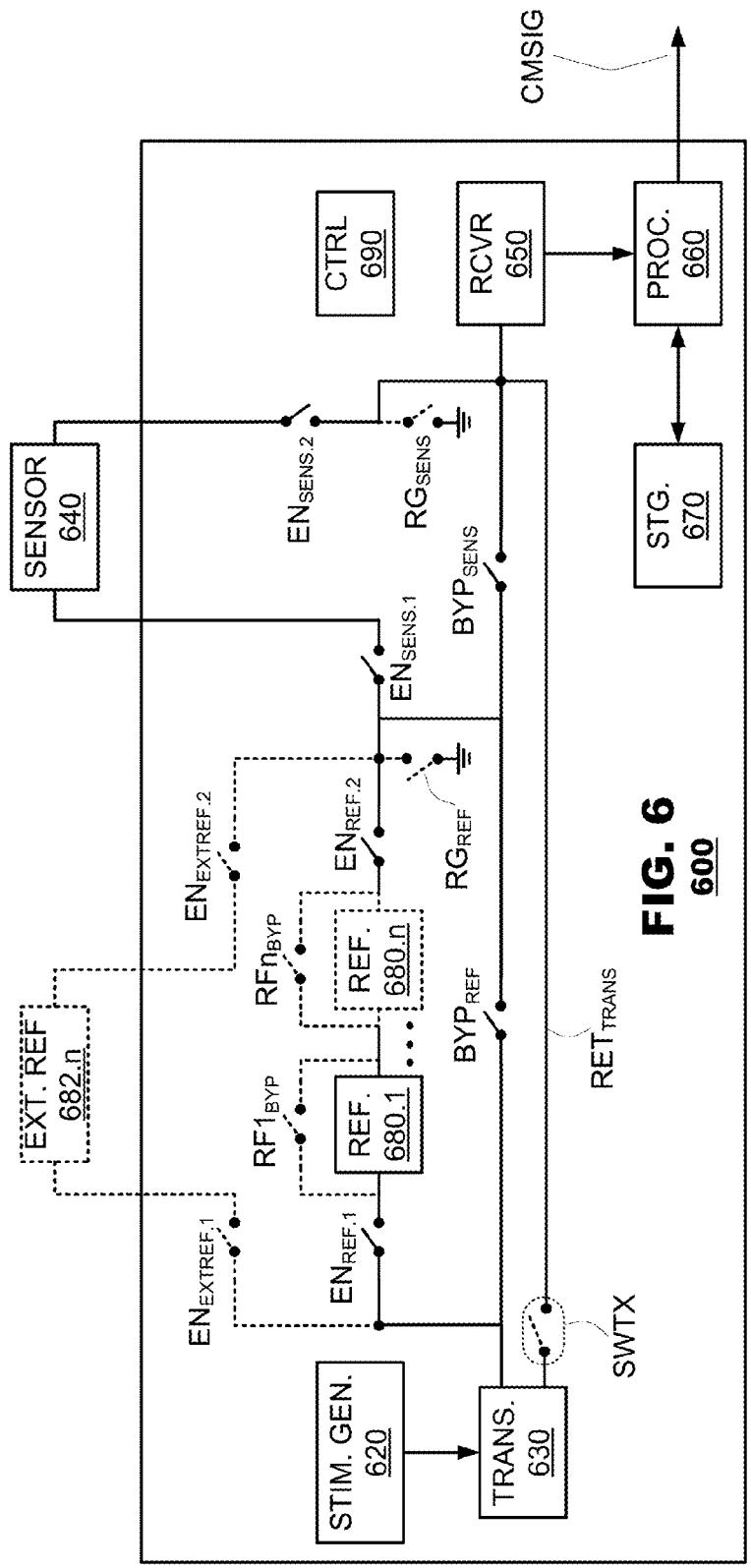
FIG. 6 illustrates another auto-calibration measurement system according to an embodiment of the present invention.

FIG. 6 illustrates another auto-calibration measurement system 600 according to an embodiment of the present invention. As illustrated, the auto-calibration measurement system 600 may include a signal processing chain having a stimulus generator 620, a transmitter 630, a sensor 640, a receiver 650, a processor 660, a data storage 670, and a controller 690. The signal processing chain may further include a reference device 680.1, which may be used for various calibration measurements for the system 600. The controller 690 may manage operation of the stimulus generator 620, transmitter 630, receiver 650, and processor 690 through control lines (not shown).

The controller 690 may also manage operation of various switches in the system 600 through control lines (not shown). A set of switches $EN_{REF.1}$, $EN_{REF.2}$, and $BYP_{REF}$ may couple the reference device 680.1 into the signal processing chain or exclude it therefrom. A set of switches $EN_{SENS.1}$, $EN_{SENS.1}$, and $BYP_{SENS}$ may couple the sensor 640 into the signal processing chain or exclude it therefrom.

The reference device 680.1 may be connected in series with the sensor 640. The reference device 680.1 may be configured such that its response may be mathematically represented as a real response or an imaginary response depending on the type of reference device 680.1 used in the system. In various embodiments, the reference device 680.1 may be a capacitor, an inductor, or a resistor.

The system 600 may operate to drive an excitation signal from the stimulus generator 620, through the signal processing chain. Similar to system 200 of FIG. 2, the system 600 of FIG. 6 may capture various calibration samples from the signal processing chain to calculate a compensated measurement signal CMSIG. For the system 600, the excitation signal may be a current signal. The controller 690 may configure various current paths through the system to capture the various signal processing chain responses. A return path $RET_{TRANS}$ may complete the current loop for the current excitation signal. The receiver 650 may capture voltage response measurements for the various processing chain configurations.

For example, say calibration samples may be captured for the reference device 680.1 and the sensor 640. The controller 690 may close corresponding switches for the reference path $EN_{REF.1}$, $EN_{REF.2}$, and for the sensor path $EN_{SENS.1}$, $EN_{SENS.2}$. Bypass switches $BYP_{REF}$ and $BYP_{SENS}$ may be left open. A current excitation signal may be driven through the signal processing chain and the receiver may capture calibration samples. A compensated measurement signal may then be calculated for either the reference device 680.1 or the sensor 640 by driving the current excitation signal through a signal processing chain including either the reference device 680.1 or the sensor 640, as applicable. For example, the sensor 640 may be excluded from the signal processing chain by opening switches $EN_{SENS.1}$, $EN_{SENS.2}$, and closing the bypass switch $BYP_{SENS}$. The current excitation signal may flow through the reference device 680.1 and back to the transmitter 640 via the return path $RET_{TRANS}$. The receiver 650 may capture measurement response samples from the signal processing chain including the reference device 680.1. The processor 660 may calculate the compensated measurement signal CMSIG from the calibration and measurement samples, which may represent the sensor 640 response to various sensor stimuli.

The system 600 may be configured to generate compensated measurement signals CMSIG for both Type I and Type II systems using both direct and adaptive calibration modes as discussed above. Equations similar to those as described in Eqs. 1-12 may be adjusted for current excitation signals to account for a 90° shift of the various signal processing chain responses for the system types and/or calibration modes.

In various embodiments, multiple reference devices 680.n may be included in the system 600. In such embodiments, each reference device 680.1-680.n may further include an individual bypass switch, shown as $RF1_{BYP}$-$RFn_{BYP}$, which may divert the current excitation signal through the signal processing chain accordingly so that calibration samples may be captured for each reference device 680.1-680.n. Multiple sensors (not shown) may be included in the system 600 in a similar manner. Bypass switches (not shown) may be included in the system 600 for each of the multiple sensors. In various embodiments, external reference devices 682.n may be coupled to the system 600 using switch pairs $EN_{EXTREF.1}$, $EN_{EXTREF.2}$. Bypass switches (not shown) may be included in the system 600 for each of the multiple external reference devices.

In an embodiment, the return path for a current excitation signal may be configured to flow to ground rather than back through the transmitter. In such an embodiment, a reference ground return switch $RG_{REF}$ may be included in the system 600 for coupling the reference device 680.1 to ground for capturing various calibration and/or measurement samples. A sensor ground return switch $RG_{SENS}$ may be included in the system 600 for coupling the sensor 640 to ground for capturing various calibration and/or measurement samples. A transmitter switch SWTX may be included in the system 600 to decouple the transmitter return path $RET_{TRANS}$.

FIG. 7 illustrates another auto-calibration measurement system 700 according to an embodiment of the present invention. As illustrated, the auto-calibration measurement system 700 may include a signal processing chain having a stimulus generator 710, a transmitter 720, a sensor 730, a receiver 740, a processor 750, a data storage 760, and a controller 770. The controller 770 may configure the signal processing chain to include a parallel measurement network 782 (e.g., the reference device/sensor configuration of FIG. 2) or a serial network 784 (e.g., the reference device/sensor configuration of FIG. 6). The controller 770 may control switching fabric, shown here as multiplexers $TX_{MUX}$, $RX_{MUX}$, and $SENS_{MUX}$ for controlling the various signal processing chain configurations for the system 700. The system 700 may operate as described above for FIGS. 2-6 to calculate various compensated measurement signals CMSIG.

In an embodiment, the system 700 may be coupled to external reference devices 790.n through switching fabric, shown here as multiplexer $EXTREF_{MUX}$. In an embodiment, the system 700 may be coupled to multiple sensors (not shown).

Several embodiments of the present invention are specifically illustrated and described herein. However, it will be appreciated that modifications and variations of the present invention are covered by the above teachings. In other instances, well-known operations, components and circuits have not been described in detail so as not to obscure the embodiments. It can be appreciated that the specific structural and functional details disclosed herein may be representative and do not necessarily limit the scope of the embodiments.

Those skilled in the art may appreciate from the foregoing description that the present invention may be implemented in a variety of forms, and that the various embodiments may be implemented alone or in combination. Therefore, while the embodiments of the present invention have been described in connection with particular examples thereof, the true scope of the embodiments and/or methods of the present invention should not be so limited since other modifications will become apparent to the skilled practitioner upon a study of the drawings, specification, and following claims.

We claim:

1. A method for operating a complex sensor measurement system, comprising:
   driving a complex excitation signal having a predetermined phase and amplitude into a measurement signal processing chain to generate a complex measurement response signal; and
   adjusting the complex measurement response signal to generate a complex calibrated measurement signal by using a complex calibration response signal captured from a calibration signal processing chain, wherein
   the measurement signal processing chain includes a transmitter, a receiver, and at least one of a reference device and a sensor,
   the calibration signal processing chain includes the transmitter, the receiver, and at least one of the reference device and the sensor, and the calibration signal processing chain is configured to be different from the measurement signal processing chain, and
   the complex calibration response signal is generated by driving the complex excitation signal into the transmitter, the receiver, and at least one of the reference device and the sensor of the calibration signal processing chain.

2. The method of claim 1, wherein the complex calibration response signal is stored in a data storage.

3. The method of claim 1, wherein the reference device comprises a capacitor.

4. The method of claim 3, the adjusting further comprising calculating real and imaginary components for the complex calibrated measurement signal from Equations 1 and 2:

$$CMSIG_{RE} = \frac{Re(X) \cdot Im(Z) - Im(X) \cdot Re(Z)}{(Re(Z))^2 + (Im(Z))^2}, \quad \text{Eq. 1}$$

$$CMSIG_{IM} = \frac{Re(X) \cdot Re(Z) + Im(X) \cdot Im(Z)}{(Re(Z))^2 + (Im(Z))^2}, \quad \text{Eq. 2}$$

wherein Re(Z) and Im(Z) represent the respective real and imaginary components for each calibration sample, and Re(X) and Im(X) represent the real and imaginary components for each measurement sample.

5. The method of claim 3, the adjusting further comprising calculating real and imaginary components for the complex calibrated measurement signal from Equations 7 and 8:

$$CMSIG_{RE} = \frac{Re(X)}{Im(Z)}, \quad \text{Eq. 7}$$

$$CMSIG_{IM} = \frac{Im(X)}{Im(Z)}, \quad \text{Eq. 8}$$

wherein Re(Z) and Im(Z) represent the respective real and imaginary components for each calibration sample, and Re(X) and Im(X) represent the real and imaginary components for each measurement sample, based on the complex measurement response signal and the complex calibration response signal.

6. The method of claim 1, wherein the reference device comprises an inductor.

7. The method of claim 6, the adjusting further comprising calculating real and imaginary components for the complex calibrated measurement signal from Equations 3 and 4:

$$CMSIG_{RE} = \frac{Im(X) \cdot Re(Z) - Re(X) \cdot Im(Z)}{(Re(Z))^2 + (Im(Z))^2}, \quad \text{Eq. 3}$$

$$CMSIG_{IM} = \frac{Re(X) \cdot Re(Z) + Im(X) \cdot Im(Z)}{(Re(Z))^2 + (Im(Z))^2}, \quad \text{Eq. 4}$$

wherein Re(Z) and Im(Z) represent the respective real and imaginary components for each calibration sample, and Re(X) and Im(X) represent the real and imaginary components for each measurement sample.

8. The method of claim 6, the adjusting further comprising calculating real and imaginary components for the complex calibrated measurement signal from Equations 9 and 10:

$$CMSIG_{RE} = -\frac{\text{Re}(X)}{\text{Im}(Z)}, \quad \text{Eq. 9}$$

$$CMSIG_{IM} = -\frac{\text{Im}(X)}{\text{Im}(Z)}, \quad \text{Eq. 10}$$

wherein Re(Z) and Im(Z) represent the respective real and imaginary components for each calibration sample, and Re(X) and Im(X) represent the real and imaginary components for each measurement sample,
based on the complex measurement response signal and the complex calibration response signal.

9. The method of claim 1, wherein the reference device comprises a resistor.

10. The method of claim 9, the adjusting further comprising calculating real and imaginary components for the complex calibrated measurement signal from Equations 5 and 6:

$$CMSIG_{RE} = \frac{\text{Re}(X) \cdot \text{Re}(Z) + \text{Im}(X) \cdot \text{Im}(Z)}{(\text{Re}(Z))^2 + (\text{Im}(Z))^2}, \quad \text{Eq. 5}$$

$$CMSIG_{IM} = \frac{\text{Im}(X) \cdot \text{Re}(Z) - \text{Re}(X) \cdot \text{Im}(Z)}{(\text{Re}(Z))^2 + (\text{Im}(Z))^2}, \quad \text{Eq. 6}$$

wherein Re(Z) and Im(Z) represent the respective real and imaginary components for each calibration sample, and Re(X) and Im(X) represent the real and imaginary components for each measurement sample.

11. The method of claim 9, the adjusting further comprising calculating real and imaginary components for the complex calibrated measurement signal from Equations 11 and 12:

$$CMSIG_{RE} = \frac{\text{Re}(X)}{\text{Re}(Z)}, \quad \text{Eq. 11}$$

$$CMSIG_{IM} = \frac{\text{Im}(X)}{\text{Re}(Z)}, \quad \text{Eq. 12}$$

wherein Re(Z) and Im(Z) represent the respective real and imaginary components for each calibration sample, and Re(X) and Im(X) represent the real and imaginary components for each measurement sample,
based on the complex measurement response signal and the complex calibration response signal.

12. The method of claim 1, the adjusting further comprising adjusting real and imaginary components for the complex calibrated measurement signal based on calibration settings for the receiver and the transmitter.

13. The method of claim 1, the adjusting further comprising adjusting real and imaginary components for the complex calibrated measurement signal based on calibration settings for the receiver and the transmitter.

14. The method of claim 1, wherein the excitation signal is a voltage signal.

15. The method of claim 1, wherein the excitation signal is a current signal.

16. The method of claim 1, wherein the sensor comprises the reference device.

17. A method for operating a complex sensor measurement system, comprising:
driving a complex excitation signal having a predetermined phase and amplitude into a first signal processing chain that includes a transmitter, a receiver, and at least one of a reference device and a sensor;
capturing a first complex response signal from the first signal processing chain generated in response to the complex excitation signal;
storing a representation of the first captured complex response signal;
driving the complex excitation signal into a second signal processing chain that includes the transmitter, the receiver, and at least one of the reference device and the sensor, the second signal processing chain being configured to be different from the first signal processing chain;
capturing a second complex response signal from the second signal processing chain generated in response to the complex excitation signal; and
adjusting the second complex response signal based on the stored representation of the first complex response signal to calibrate the second complex response signal.

18. The method of claim 17, wherein the reference device comprises a capacitor.

19. The method of claim 18, the adjusting further comprising calculating real and imaginary components for the calibrated second complex response signal from Equations 1 and 2:

$$CMSIG_{RE} = \frac{\text{Re}(X) \cdot \text{Im}(Z) - \text{Im}(X) \cdot \text{Re}(Z)}{(\text{Re}(Z))^2 + (\text{Im}(Z))^2}, \quad \text{Eq. 1}$$

$$CMSIG_{IM} = \frac{\text{Re}(X) \cdot \text{Re}(Z) + \text{Im}(X) \cdot \text{Im}(Z)}{(\text{Re}(Z))^2 + (\text{Im}(Z))^2}, \quad \text{Eq. 2}$$

wherein Re(Z) and Im(Z) represent the respective real and imaginary components for each calibration sample, and Re(X) and Im(X) represent the real and imaginary components for each measurement sample.

20. The method of claim 17, wherein the reference device comprises an inductor.

21. The method of claim 20, the adjusting further comprising calculating real and imaginary components for the calibrated second complex response signal from Equations 3 and 4:

$$CMSIG_{RE} = \frac{\text{Im}(X) \cdot \text{Re}(Z) - \text{Re}(X) \cdot \text{Im}(Z)}{(\text{Re}(Z))^2 + (\text{Im}(Z))^2}, \quad \text{Eq. 3}$$

$$CMSIG_{IM} = -\frac{\text{Re}(X) \cdot \text{Re}(Z) + \text{Im}(X) \cdot \text{Im}(Z)}{(\text{Re}(Z))^2 + (\text{Im}(Z))^2}, \quad \text{Eq. 4}$$

wherein Re(Z) and Im(Z) represent the respective real and imaginary components for each calibration sample, and Re(X) and Im(X) represent the real and imaginary components for each measurement sample.

22. The method of claim 17, wherein the reference device comprises a resistor.

23. The method of claim 22, the adjusting further comprising calculating real and imaginary components for the calibrated second complex response signal from Equations 5 and 6:

$$CMSIG_{RE} = \frac{Re(X) \cdot Re(Z) + Im(X) \cdot Im(Z)}{(Re(Z))^2 + (Im(Z))^2}, \quad \text{Eq. 5}$$

$$CMSIG_{IM} = \frac{Im(X) \cdot Re(Z) - Re(X) \cdot Im(Z)}{(Re(Z))^2 + (Im(Z))^2}, \quad \text{Eq. 6}$$

wherein Re(Z) and Im(Z) represent the respective real and imaginary components for each calibration sample, and Re(X) and Im(X) represent the real and imaginary components for each measurement sample.

24. A method for operating a complex sensor measurement system, comprising: on a trial and error basis:
    driving a complex excitation signal having a predetermined phase and amplitude into a first signal processing chain that includes a transmitter, a reference device, and a receiver;
    capturing a first complex response signal from the first signal processing chain generated in response to the complex excitation signal;
    comparing a parameter of the first complex response signal to a predetermined threshold;
    if the parameter of the first complex response signal is below the predetermined threshold:
        storing the first complex response signal;
        driving the complex excitation signal into a second signal processing chain that includes the transmitter, a sensor, and the receiver;
        capturing a second complex response signal from the second signal processing chain generated in response to the complex excitation signal;
        adjusting the second complex response signal to generate a calibrated second complex response signal; and
    if the parameter of the first complex response signal is above the predetermined threshold, updating the phase of the excitation signal to minimize the parameter of the first complex response signal to below the predetermined threshold and repeating the driving, the capturing, and the comparing for the first signal processing chain.

25. The method of claim 24, wherein the predetermined threshold comprises an upper and lower threshold limit and the method operates to minimize the parameter of the first complex response signal to within the upper and lower threshold limits.

26. The method of claim 24, wherein the reference device comprises a capacitor and the predetermined threshold is compared to a real component of the first complex response signal.

27. The method of claim 26, the adjusting further comprising calculating real and imaginary components for the calibrated second complex response signal from Equations 7 and 8:

$$CMSIG_{RE} = \frac{Re(X)}{Im(Z)}, \quad \text{Eq. 7}$$

$$CMSIG_{IM} = \frac{Im(X)}{Im(Z)}, \quad \text{Eq. 8}$$

wherein Re(Z) and Im(Z) represent the respective real and imaginary components for each calibration sample, and Re(X) and Im(X) represent the real and imaginary components for each measurement sample, based on the second complex response signal and the stored first complex response signal.

28. The method of claim 24, wherein the reference device comprises an inductor and the predetermined threshold is compared to a real component of the first complex response signal.

29. The method of claim 28, the adjusting further comprising calculating real and imaginary components for the calibrated second complex response signal from Equations 9 and 10:

$$CMSIG_{RE} = -\frac{Re(X)}{Im(Z)}, \quad \text{Eq. 9}$$

$$CMSIG_{IM} = -\frac{Im(X)}{Im(Z)}, \quad \text{Eq. 10}$$

wherein Re(Z) and Im(Z) represent the respective real and imaginary components for each calibration sample, and Re(X) and Im(X) represent the real and imaginary components for each measurement sample, based on the second complex response signal and the stored first complex response signal.

30. The method of claim 24, wherein the reference device comprises a resistor and the predetermined threshold is compared to an imaginary component of the first complex response signal.

31. The method of claim 30, the adjusting further comprising calculating real and imaginary components for the calibrated second complex response signal from Equations 11 and 12:

$$CMSIG_{RE} = \frac{Re(X)}{Re(Z)}, \quad \text{Eq. 11}$$

$$CMSIG_{IM} = \frac{Im(X)}{Re(Z)}, \quad \text{Eq. 12}$$

wherein Re(Z) and Im(Z) represent the respective real and imaginary components for each calibration sample, and Re(X) and Im(X) represent the real and imaginary components for each measurement sample, based on the second complex response signal and the stored first complex response signal.

32. The method of claim 24, the adjusting further comprising adjusting real and imaginary components for the calibrated second complex response signal based on calibration settings for the receiver and the transmitter.

33. An apparatus for generating a calibrated complex measurement signal, comprising:
    a system having a transmitter, a sensor, a reference device, a receiver, and switch connections for the sensor terminals and the reference device terminals, wherein, in a first switch configuration, the system defines a calibration signal pathway that includes the transmitter, the receiver, and the reference device and, in a second switch configuration, the system defines an operational signal pathway that includes the transmitter, the receiver, and the sensor;
    a controller;
    a processor to perform calculations on complex measurement signals obtained from the operational signal pathway based on complex measurement signals obtained from the calibration signal pathway; and
    a data storage.

34. The apparatus of claim 33, further comprising a stimulus generator.

35. The apparatus of claim 33, wherein the reference device comprises a capacitor.

36. The apparatus of claim 33, wherein the reference device comprises an inductor.

37. The apparatus of claim 33, wherein the reference device comprises a resistor.

38. The apparatus of claim 33, wherein the reference device is coupled in parallel with the sensor.

39. The apparatus of claim 33, wherein the reference device is coupled in series with the sensor.

40. The apparatus of claim 33, the transmitter, the reference device, the receiver, the processor, the controller, and the data storage are manufactured in a common integrated circuit and the sensor is provided external to the integrated circuit.

41. The apparatus of claim 40, further comprising input/output terminals for communication with external processors.

42. The apparatus of claim 40, further comprising input/output terminals for communication with external controllers.

43. The apparatus of claim 40, further comprising input/output terminals for coupling to external reference devices.

44. The apparatus of claim 40, further comprising input/output terminals for coupling to external sensors.

45. The apparatus of claim 40, further comprising input/output terminals for coupling to external stimulus generators.

46. The apparatus of claim 33, wherein the transmitter, the sensor, the reference device, the receiver, the processor, the controller, and the data storage are manufactured in a common integrated circuit.

47. An apparatus, comprising:
a transmitter and a receiver;
a system extending between the transmitter and receiver including a sensor, a reference device, and multiplexers, wherein, in a first multiplexer configuration, the system defines a calibration signal pathway that includes the transmitter, the receiver, and the reference device and, in a second multiplexer configuration, the system defines an operational signal pathway that includes the transmitter, the receiver, and the other of the reference device and the sensor; and
a processor to derive calibrations of a complex excitation signal extending through the transmitter, the operational signal pathway, and the receiver based on measurements obtained from the calibration signal pathway.

48. The apparatus of claim 47, further comprising a stimulus generator to generate the complex excitation signal.

49. The apparatus of claim 47, wherein the reference device comprises a capacitor.

50. The apparatus of claim 47, wherein the reference device comprises an inductor.

51. The apparatus of claim 47, wherein the reference device comprises a resistor.

52. The apparatus of claim 47, wherein the reference device is coupled in parallel with the sensor.

53. The apparatus of claim 47, wherein the reference device is coupled in series with the sensor.

* * * * *